United States Patent [19]
Sasakura et al.

[11] Patent Number: 5,988,482
[45] Date of Patent: Nov. 23, 1999

[54] DISCHARGE ABNORMALITY DETECTION DEVICE AND METHOD FOR USE IN WIRE BONDING APPARATUS

[75] Inventors: Kazumasa Sasakura, Musashimurayama; Yoshimitsu Terakado, Hachijoji, both of Japan

[73] Assignee: Kabushiki Kaisha Shinkawa, Tokyo, Japan

[21] Appl. No.: 09/028,528

[22] Filed: Feb. 24, 1998

[30] Foreign Application Priority Data

Feb. 24, 1997 [JP] Japan .................................. 9-055556

[51] Int. Cl.$^6$ .................................................. H01L 21/60
[52] U.S. Cl. ..................... 228/103; 228/56.5; 219/56.21; 219/56.22
[58] Field of Search ................................ 228/102, 180.5, 228/9, 4.5, 56.5, 103; 219/56.21, 56.22

[56] References Cited

U.S. PATENT DOCUMENTS

| | | | |
|---|---|---|---|
| 4,687,897 | 8/1987 | McKiel, Jr. | 219/56.21 |
| 5,463,197 | 10/1995 | Miyazaki | 219/56.22 |
| 5,763,849 | 6/1998 | Nakao | 219/56.21 |

FOREIGN PATENT DOCUMENTS

| | | |
|---|---|---|
| H1-256134 | 10/1989 | Japan . |
| H5-36748 | 2/1993 | Japan . |
| H7-37930 | 2/1995 | Japan . |
| H7-147297 | 6/1995 | Japan . |

*Primary Examiner*—Patrick Ryan
*Assistant Examiner*—Jeffrey T. Knapp
*Attorney, Agent, or Firm*—Koda & Androlia

[57] ABSTRACT

A device and method is available for detecting abnormalities of an electric discharge generated for forming a ball at the end of a bonding wire in a bonding apparatus. A high voltage is applied across the bonding wire and an electrode, and the maximum value of the applied high voltage is detected and sent, via a peak hold circuit, to a computer that compares the maximum high voltage with an insulation breakdown voltage of a normal detection range and calculates a gap between the end of the bonding wire and the electrode, thus determining the discharge abnormalities based upon the result of the calculation of the gap.

4 Claims, 5 Drawing Sheets

DISCHARGE ABNORMALITY DETECTION DEVICE AND METHOD FOR USE IN WIRE BONDING APPARATUS

BACKGROUND OF THE INVENTION

1. Field of the Invention

The present invention relates to a discharge abnormality detection device and method used in a wire bonding apparatus which forms a ball at the end of a wire by means of a discharge.

2. Prior Art

In a wire bonding apparatus, as shown in FIG. 7, a wire 2 is held by a clamper 1, and a ball is formed on the tip end of the wire 2 using a high voltage generating device 5 that applies a high voltage across a discharge electrode 4 and the tip end of the wire 2 passing through a capillary 3. The high voltage generating device 5 includes a constant-current power supply circuit, and the discharge voltage is detected by a voltage detection part 6.

Example discharge abnormalities are an improper gap between the wire 2 and the discharge electrode 4, contamination 2a on the surface of the wire 2 and contamination 4a of the surface of the discharge electrode 4 as shown in FIG. 8, and interference with the discharge that is caused by gas currents as shown in FIG. 9.

FIG. 9 is an explanatory diagram of the essential structural elements of Japanese Patent Application Pre-Examination Publication (Kokai) No. 7-147297.

In FIG. 9, a gas 22 such as air or some other gas is blown onto the bonding horn 20 (which holds a capillary 3 at one end thereof) from horn cooling pipes 21 so as to prevent thermal expansion of the bonding horn 20. If the gas currents 22a interfere with the electric discharge of the discharge electrode 4, the direction of the discharge is changed, or the discharge may be blown out, thus causing discharge abnormalities.

In Japanese Patent Application Pre-Examination Publication (Kokai) Nos. 1-256134, 5-36748 and No. 7-37930 disclose a formation of a gas atmosphere in the discharge region between the wire and the discharge electrode. In these cases, when the flow velocity of the gas supplied to the discharge region is too high, discharge abnormalities also occurs.

Various states of the tail of the wire 2 protruding from the tip end of the capillary 3 during the ball formation are shown in FIGS. 3 and 4.

FIG. 3(a) shows an improper state in which the wire 2 is not extended out from the tip end of the capillary 3. In FIG. 3(b), the wire 2 contacts the discharge electrode 4, which is another type of improper state.

FIG. 4 shows the different types of improper states in which an unnecessary length of the tail of the wire extends from the tip end of the capillary 3 during ball formation. In FIG. 4(a), the tail is bent away from the discharge electrode 4, so that the discharge gap between the tip end of the wire 2 and the discharge electrode 4 is too wide, thus causing the tip end of the wire 2 to be positioned outside the normal detection range 7. In FIG. 4(b), the tail is bent toward the discharge electrode 4, so that the discharge gap between the tip end of the wire 2 and the discharge electrode 4 is too narrow, thus causing the tip end of the wire 2 to be positioned outside the normal detection range 7.

To the contrary, FIG. 4(c) shows a proper state of the tail of the wire; and in the proper state, the tip end of the wire 2 is positioned inside the normal detection range 7.

FIG. 5 shows the discharge voltage values detected by the voltage detection part 6 shown in FIG. 7. The states shown in the FIGS. 3(a) and 4(a) are treated as open detection, while the states shown in FIGS. 3(b) and 4(b) are treated as short detection.

A discharge voltage in the normal state shown in FIG. 4(c) will be described first. As seen from the right-end column in FIG. 5, when the discharge command 8 is initiated, a large insulation breakdown voltage $Vpc_4$ is generated in order to break down the air (insulation) between the tip end of the wire 2 and the discharge electrode 4; and after this insulation breakdown, a discharge maintenance voltage $Vc_4$ is generated.

However, when there is no tail (i. e., in cases where the wire 2 is not extended out of the tip end of the capillary 3) as shown in FIG. 3(a), the discharge maintenance voltage $Va_3$ is the same as the insulation breakdown voltage $Vpa_3$ as shown in the left-end column. Furthermore, when the wire 2 is in contact with the discharge electrode 4 (i. e., in cases where the wire 2 shorts out) as shown in FIG. 3(b), no electric discharge occurs, so that the discharge maintenance voltage $Vb_3$ is an extremely small voltage.

As seen from the above, the magnitudes of the respective voltages (discharge maintenance voltages) after a fixed time has passed following the initiation of the discharge can be expressed by Equation 1 below; and magnitudes of the respective insulation breakdown voltages can be expressed by Equation 2 below.

$$Va_3 > Va_4 > Vc_4 > Vb_4 > Vb_3 \qquad \text{[Equation 1]}$$

$$Vpa_3 > Vpa_4 > Vpc_4 > Vpb_4 > Vpb_3 \qquad \text{[Equation 2]}$$

Accordingly, detection of improper tail states are accomplished by examining changes in the discharge maintenance voltages $Va_3$, $Va_4$, $Vc_4$, $Vb_4$ and $Vb_3$ which are shown in FIG. 5 after a fixed time has passed following the initiation of the discharge.

In the meantime, the relationship between the discharge maintenance voltage and the discharge gap between the tip end of the wire 2 and the discharge electrode 4 is as shown in FIG. 6. As seen from FIG. 6, in the case of the open detection and short detection shown in FIGS. 3(a) and 3(b), a large difference appears in the discharge maintenance voltages $Va_3$ and $Vb_3$; thus detection is easy. However, in the case of the discharge maintenance voltages $Va_4$ and $Vb_4$ involved in bending of the wire 2 as shown in FIGS. 4(a) and 4(b), there is almost no difference from the discharge maintenance voltage $Vc_4$ shown in FIG. 4(c); as a result, the detection of discharge abnormalities is difficult.

Furthermore, when discharge interference caused by contamination of the wire surface, contamination of the surface of the discharge electrode or gas currents, etc. occurs, a discharge fails to be generated, resulting in a voltage such as $Va_3$ as show in FIG. 5.

SUMMARY OF THE INVENTION

Accordingly, the object of the present invention is to provide a discharge abnormality detection device and method used in a wire bonding apparatus which detects electric discharge abnormalities caused by various reasons including an improper gap between the wire and discharge electrode, an interference with the discharge due to contamination of the wire and/or discharge electrode surface, gas currents, etc.

The object of the present invention is accomplished by a unique discharge abnormality detection device for a wire bonding apparatus wherein the bonding apparatus includes a ball forming device that forms a ball by applying a high voltage across a discharge electrode and the tip of a wire passing through a capillary, and the detection device judges discharge abnormalities based upon a discharged voltage detected by a voltage detection part of the ball forming device, and the detection device comprises: a peak hold circuit which stores a maximum output voltage of the output voltage waveform detected by the voltage detection part, and a computer which compares the maximum output voltage held by the peak hold circuit with an insulation breakdown voltage in the normal detection range so as to judge whether or not the discharge is abnormal.

Furthermore, the object of the present invention is accomplished by a unique discharge abnormality detection method for a wire bonding apparatus wherein the bonding apparatus includes a ball forming device that forms a ball by applying a high voltage across a discharge electrode and the tip of a wire passing through a capillary and the detection device judges discharge abnormalities based upon a discharged voltage detected by a voltage detection part of the ball forming device, and the detection method judges whether or not the discharge is abnormal by comparing a maximum output voltage of the output voltage detected by the voltage detection part with an insulation breakdown voltage in the normal detection range.

BRIEF DESCRIPTION OF THE DRAWINGS

FIG. 3 shows the states of the tail of the wire in which FIG. 3(a) shows an open state, while

FIG. 4 shows the states of the tail of the wire in which

DETAILED DESCRIPTION OF THE INVENTION

Figure 7:
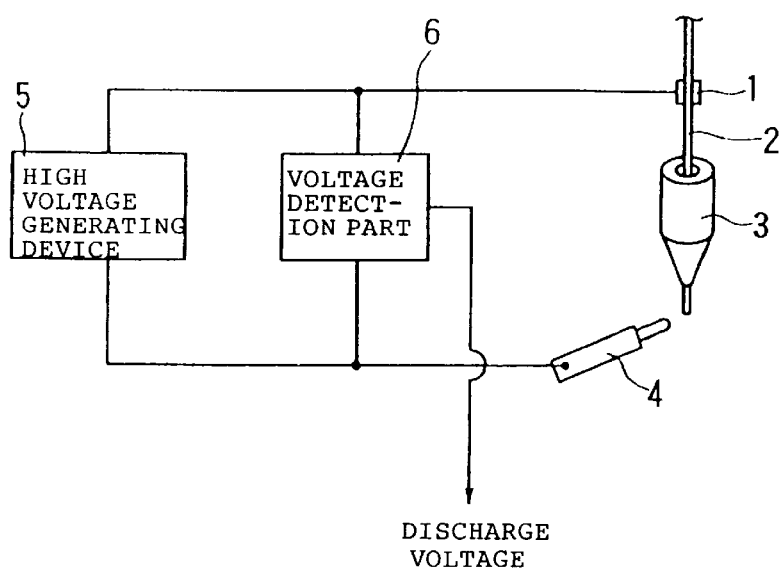
FIG. 7 is a block diagram of a ball forming device used in a wire bonding apparatus.

One embodiment of the present invention will be described with reference to FIGS. 1 and 2. Constituting elements which are the same as in FIG. 7 showing a prior art ball forming device or which correspond to the elements shown in FIG. 7 will be referred to by the same reference numerals.

Figure 1:
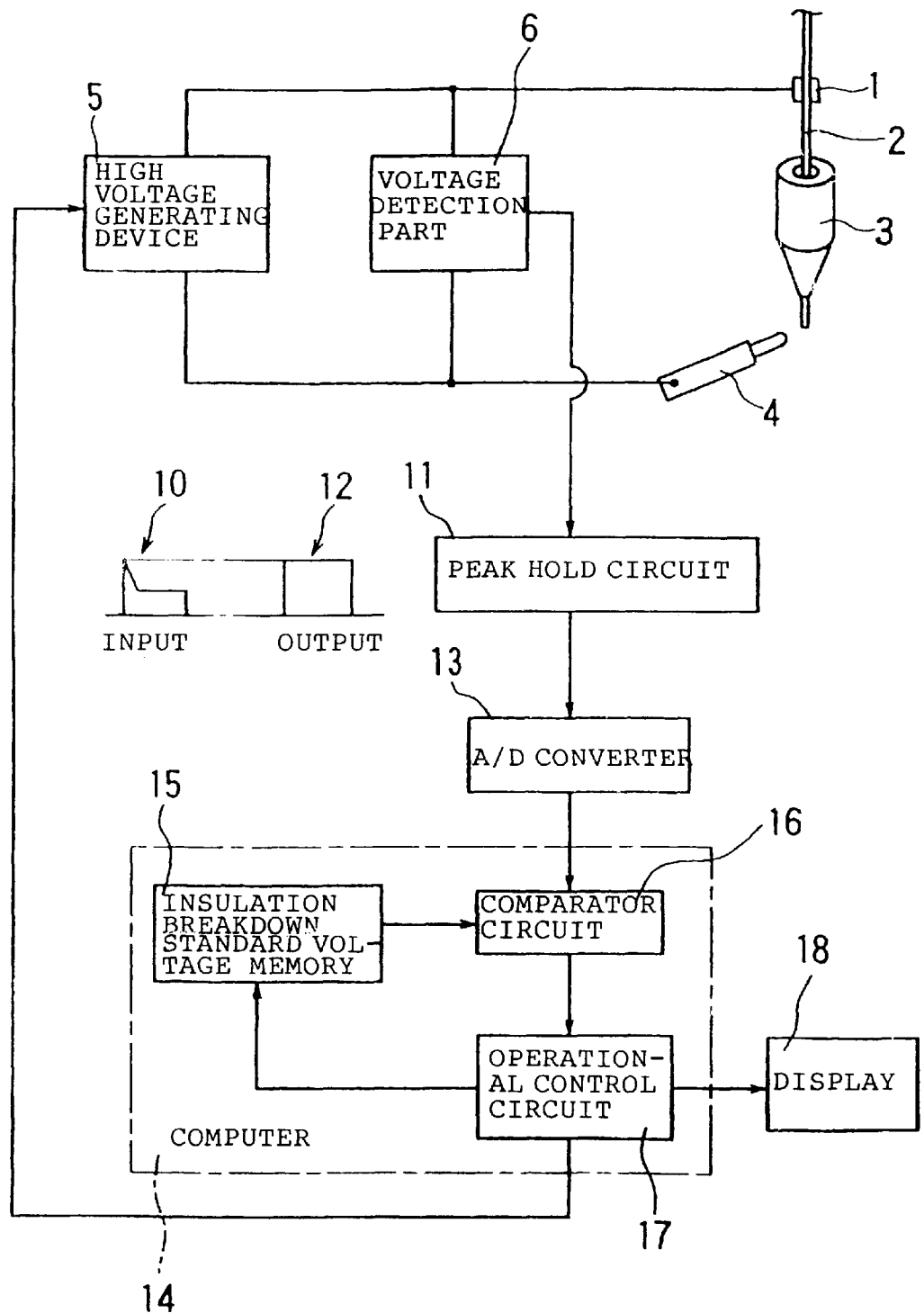
FIG. 1 is a block diagram of a discharge abnormality detection device for use in a wire bonding apparatus according to one embodiment of the present invention.

As shown in FIG. 1, the ball forming device includes a high voltage generating device 5 and a voltage detection part 6. The high voltage generating device 5 includes a constant-current power supply circuit (now shown) and applies a discharge voltage between the discharge electrode 4 and the wire 2; and such an applied high voltage is detected by the voltage detection part 6.

An output voltage waveform 10 detected by the voltage detection part 6 is inputted into a peak hold circuit 11. The peak hold circuit 11 holds the largest voltage out of the analog voltage that is inputted therein and continues to output a voltage. The peak hold circuit 11 outputs a maximum output voltage waveform 12 which holds the maximum voltage of the output voltage waveform 10.

The analog data of this maximum output voltage waveform 12 is converted into a digital data by an A/D converter 13 and then inputted into a computer 14. The peak hold circuit 11 and the computer 14 are connected via a conductive material such as an electric wire or an insulation material such as an optical fiber, etc.

Figure 4A:
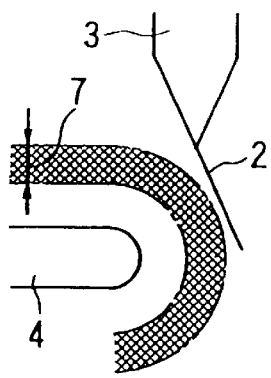
FIGS. 4(a) and 4(b) show the bends of the tail.
Figure 4B:
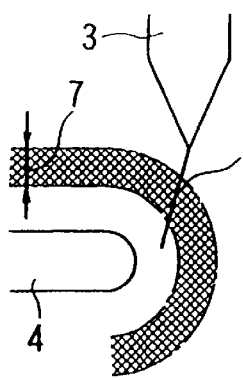
Figure 4C:
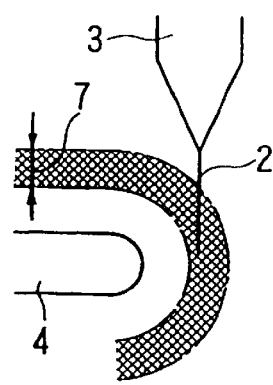
FIG. 4(c) shows a normal tail.
Figure 5:
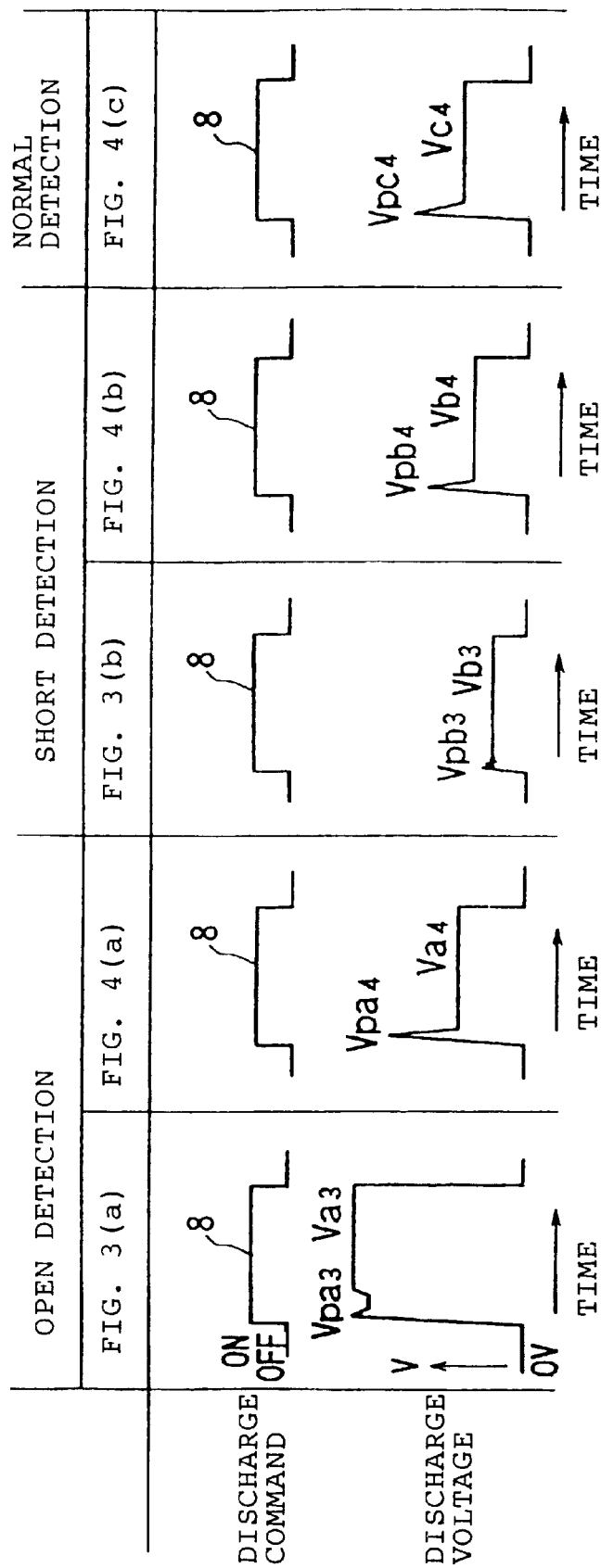
FIG. 5 shows various discharge voltages according to the state of the tail of the wire.
Figure 6:
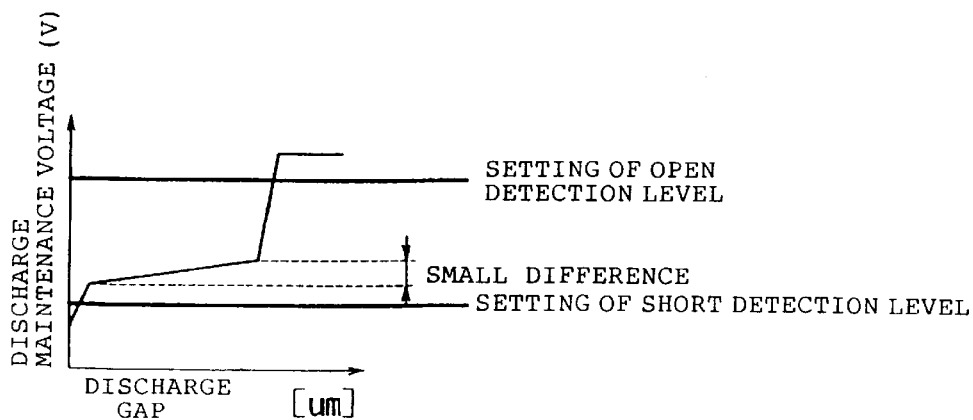
FIG. 6 is a graph showing the relationship between the discharge gap and the discharge maintenance voltage.

The computer 14 includes an insulation breakdown standard voltage memory 15, a comparator circuit 16 and an operational control circuit 17 which is connected to a display 18. The insulation breakdown standard voltage memory 15 stores the maximum and minimum insulation breakdown voltages in the normal and abnormal detection range 7 shown in FIG. 4. The comparator circuit 16 compares the insulation breakdown voltages stored in the insulation breakdown standard voltage memory 15 with the output data of the A/D converter 13. The operational control circuit 17 processes the data compared by the comparator circuit 16 and judges whether or not the discharge gap is within the normal detection range 7.

When a discharge abnormality which is outside the normal detection range 7 is ascertained by the operational control circuit 17, the fact that the electric discharge is abnormal is displayed on the display 18.

Next, the operation of the present invention will be described.

When a ball is to be formed, a discharge command 8 is sent to the high voltage generating device 5 from the computer 14. The high voltage generating device 5 applies a high voltage across the wire 2 and the discharge electrode 4. Since the high voltage generating device 5 includes a constant-current power supply circuit (not shown), the output voltage waveform 10 is controlled when the discharge command 8 is being outputted so that the discharge maintenance voltage is kept as a stable voltage. The discharge voltage during this process is detected by the voltage detection part 6, and the output voltage waveform 10 is sent to the peak hold circuit 11.

The peak hold circuit 11 holds therein the largest voltage out of the received signal of the output voltage waveform 10 and sends a maximum output voltage waveform 12, that holds this maximum voltage, to the A/D converter 13.

The A/D converter 13 converts the analog data signal of the maximum output voltage waveform 12 into a digital data signal and sends this signal to the comparator circuit 16. The comparator circuit 16 compares the insulation breakdown voltages stored in the insulation breakdown standard voltage memory 15 with the data of the maximum output voltage waveform 12 provided by the A/D converter 13.

Then, the operational control circuit 17 calculates the discharge gap between the tip end of the wire 2 and the discharge electrode 4 based upon this compared data. If the discharge gap is outside the normal detection range 7, then this is judged to be a discharge abnormality, and such a abnormality is displayed on the display 18.

Figure 2:
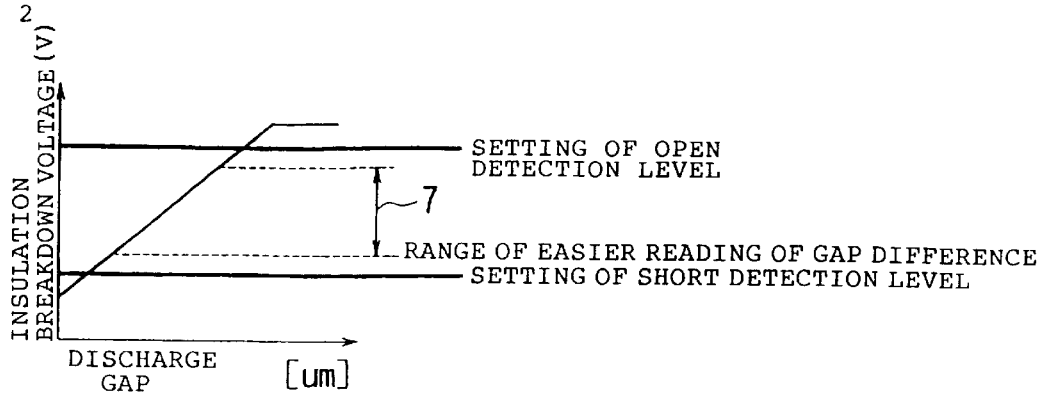
FIG. 2 is a graph showing the relationship between the discharge gap and the insulation breakdown voltage.
Figure 3A:
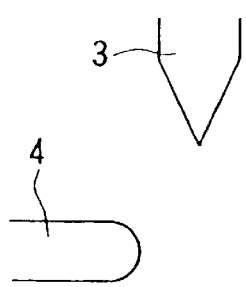
Figure 3B:
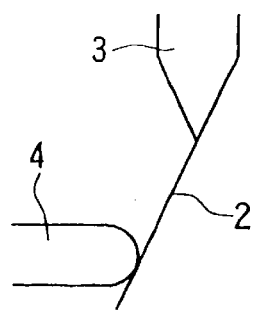
FIG. 3(b) shows a shorted state.
Figure 8:
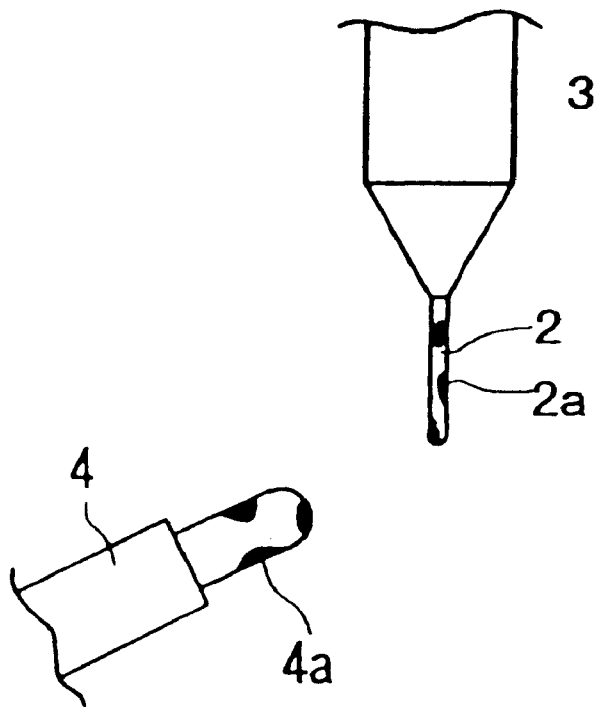
FIG. 8 illustrates is an explanatory diagram showing the adhesion of contamination to the wire and discharge electrode.
Figure 9:
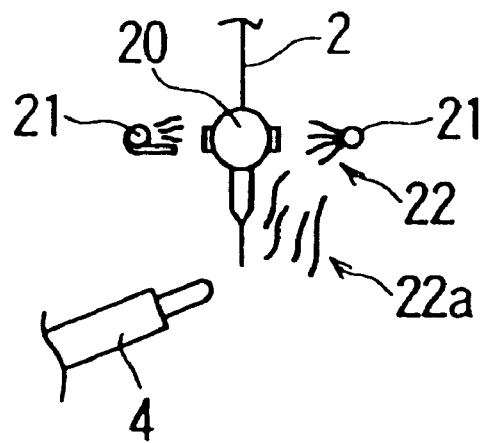
FIG. 9 illustrates a bonding horn with a gas being blown thereto.

As to the relationship between the discharge gap and the insulation breakdown voltage, a great difference occurs, as shown in FIG. 2, in the insulation breakdown voltage depending upon the discharge gap. In the present embodiment, since the maximum output voltage waveform 12 of the insulation breakdown voltage is processed so as to find the discharge abnormalities, differences in the discharge gap can be detected. In other words, an improper discharge caused by a bend of the tail portion of a wire such as those shown in FIGS. 4(a) and 4(b) can be detected; and in addition, improper discharges caused by discharge interference resulting from contaminations 2a and 4a on the wire 2 and discharge electrode 4 as shown in FIG. 8 or by gas currents 22a existing between the wire 2 and the discharge electrode 4 as shown in FIG. 9 can also be detected. These improper discharges could not be detected by conventional detection devices.

Furthermore, it goes without saying that the present invention is applicable not only to a so-called positive discharge system in which the wire 2 is set to be a + (positive) electrode or has a − (negative) potential, and the discharge electrode is set to be a − (negative) electrode or has a + (positive) potential but also to a so-called negative discharge system in which the wire 2 is set to be a − (negative) electrode or has a + (positive) potential and the discharge electrode 4 is set to be a + (positive) electrode or has a − (negative) potential.

As seen from the above, the device and method of the present invention includes a peak hold circuit which stores the maximum output voltage of the output voltage waveform detected by a voltage detection part, and a computer which compares the maximum output voltage waveform that holds the maximum output voltage provided by the peak hold circuit with the insulation breakdown voltage in the normal detection range so as to judge whether or not the discharge is abnormal. Accordingly, discharge abnormalities are detected assuredly.

What is claimed is:

1. A discharge abnormality detection method for a wire bonding apparatus wherein said bonding apparatus includes a ball forming device that forms a ball by applying a high voltage across a discharge electrode and a tip of a wire passing through a capillary and said detection method detects discharge abnormalities based upon a discharged voltage which is detected by a voltage detection part of said ball forming device, said detection method comparing a maximum output voltage detected by said voltage detection part with an insulation breakdown voltage of a normal detection range, and then judging said discharge abnormalities based upon a result of said comparing.

2. A method according to claim 1, wherein said maximum output voltage is compared in a form of a representative signal.

3. A discharge abnormality detection device for a wire bonding apparatus wherein said bonding apparatus includes a ball forming device that forms a ball by applying a high voltage across a discharge electrode and a tip of a wire passing through a capillary and said detection device detects discharge abnormalities based upon a discharged voltage detected by a voltage detection part of said ball forming device, said detection device comprising:

a peak hold circuit which holds and outputs a maximum output voltage detected by said voltage detection part, and a computer which compares said maximum output voltage outputted by said peak hold circuit with an insulation breakdown voltage of a normal detection range, thus judging said discharge abnormality.

4. A device according to claim 3, wherein said maximum output voltage is outputted by said peak hold circuit in a form of a representative signal.

* * * * *